United States Patent
Zhong et al.

(10) Patent No.: US 9,429,635 B2
(45) Date of Patent: Aug. 30, 2016

(54) ADAPTIVE AND INTERACTIVE ASSESSMENT OF TISSUE PROPERTIES IN MR IMAGING

(71) Applicants: Xiaodong Zhong, Lilburn, GA (US); Marcel Dominik Nickel, Erlagen (DE); Stephan Kannengiesser, Wuppertal (DE)

(72) Inventors: Xiaodong Zhong, Lilburn, GA (US); Marcel Dominik Nickel, Erlagen (DE); Stephan Kannengiesser, Wuppertal (DE)

(73) Assignees: Siemens Medical Solutions USA, Inc., Malvern, PA (US); Siemens Aktiengesellschaft, Munich (DE)

( * ) Notice: Subject to any disclaimer, the term of this patent is extended or adjusted under 35 U.S.C. 154(b) by 464 days.

(21) Appl. No.: 14/054,914

(22) Filed: Oct. 16, 2013

(65) Prior Publication Data
US 2014/0125336 A1   May 8, 2014

Related U.S. Application Data

(60) Provisional application No. 61/722,281, filed on Nov. 5, 2012.

(51) Int. Cl.
*G01V 3/00* (2006.01)
*G01R 33/48* (2006.01)
*G01R 33/50* (2006.01)

(52) U.S. Cl.
CPC ........... *G01R 33/4828* (2013.01); *G01R 33/50* (2013.01)

(58) Field of Classification Search
CPC ............ G01R 33/4828; G01R 33/481; G01R 33/5608; G01R 33/5611
USPC ........................................................ 324/309
See application file for complete search history.

(56) References Cited

U.S. PATENT DOCUMENTS

| | | | |
|---|---|---|---|
| 6,430,430 B1 * | 8/2002 | Gosche | G06T 7/0012 128/920 |
| 2008/0218169 A1 * | 9/2008 | Bookwalter | G01R 33/4828 324/309 |
| 2009/0261823 A1 * | 10/2009 | Yu | G01R 33/4828 324/307 |
| 2009/0276187 A1 * | 11/2009 | Martin | G01N 24/08 702/189 |
| 2010/0127704 A1 * | 5/2010 | Warntjes | G01R 33/56 324/309 |

\* cited by examiner

*Primary Examiner* — Walter L Lindsay, Jr.
*Assistant Examiner* — Frederick Wenderoth (57) ABSTRACT

Embodiments relate to evaluating properties of tissues with magnetic resonance imaging (MRI). A MR image is used to measure a characteristic that influences a particular chemical property of a tissue. In an exemplary embodiment, tissue transverse relaxation values or relaxation rates, which can readily be measured from MR images, are used to evaluate iron deposition in tissue. Iron deposition influences the tissue transverse relaxation values ($T_2$ or $T_2^*$) or relaxation rates ($R_2 = 1/T_2$ or $R_2^* = 1/T_2^*$). A clinically relevant $R_{2CR}^*$ map is calculated based on the known values of the effective $R_{2eff}^*$, the water $R_{2w}^*$, and the fat $R_{2f}^*$ by incorporating the most relevant value for each individual image element of a plurality of image elements of an MR image of the tissue. The clinically relevant $R_{2CR}^*$ map provides an accurate evaluation of iron deposition in any region of the tissue with the use of one map.

21 Claims, 4 Drawing Sheets

ADAPTIVE AND INTERACTIVE ASSESSMENT OF TISSUE PROPERTIES IN MR IMAGING

CROSS-REFERENCE TO RELATED APPLICATIONS

This application claims priority to U.S. Provisional Patent Application No. 61/722,281 filed Nov. 5, 2012, which is incorporated herein by reference in its entirety.

TECHNOLOGY FIELD

The present invention relates generally to evaluating properties of tissues with magnetic resonance imaging (MRI), and more particularly to evaluating iron deposition in tissue from values obtained from MR images.

BACKGROUND

Evaluation of iron deposition in tissue is of clinical interest as many diseases influence the iron deposition in tissue or organs. Evaluation of iron deposition may be achieved through magnetic resonance imaging (MRI). MRI is a desirable technique as it is non-invasive and images an entire organ. It is known that iron deposition influences the tissue transverse relaxation values ($T_2$ or $T_2^*$) or relaxation rates ($R_2 = 1/T_2$ or $R_2^* = 1/T_2^*$), and these values can be measured by MRI. Different known methods may be used to measure pixel-wise $R_2$ or $R_2^*$ values, and corresponding $T_2$ or $T_2^*$ values, on MR images, also referred to as maps.

Different species in tissue, such as water and fat, have different $R_2^*$ values. While a water $R_{2w}^*$ value accurately reflects the iron deposition in most tissues or organs, it may be inaccurate for some regions, such as those with a high fat percentage. Typically, the iron deposition has little influence on fat $R_{2f}^*$. An effective $R_{2eff}^*$ value is a $R_2^*$ value of a water-fat mixture and is generally used for iron deposition evaluation. However, the effective $R_{2eff}^*$ value also does not accurately reflect the iron deposition in regions with a high fat percentage. Therefore, radiologists or physicians may be required to read and compare the effective $R_{2eff}^*$, water $R_{2w}^*$, and fat $R_{2f}^*$ maps side by side to evaluate the iron deposition of tissue. This is inconvenient, difficult, and confusing in practice.

This document describes a method and system for providing a clinically relevant $R_{2CR}^*$ map based on the known values of the effective $R_{2eff}^*$, the water $R_{2w}^*$, and the fat $R_{2f}^*$.

SUMMARY

Embodiments of the present invention provide a system and method for evaluating properties of tissue from Magnetic Resonance (MR) signal data of the tissue. An image data processor is configured to select, for each of an individual image element of a plurality of individual image elements of an MR image of the tissue, one of a plurality of parameters of the tissue; and a display processor is configured to generate data representing the MR image using the selected parameter to represent the individual image element.

In an embodiment, the parameters of the tissue comprise parameters related to iron deposition in the tissue. The parameters may comprise at least one of tissue transverse relaxation values and tissue transverse relaxation rates. In an embodiment, the parameters may comprise at least one of (i) a transverse relaxation rate of fat; (ii) a transverse relaxation rate of water; and (iii) a composite transverse relaxation rate of both water and fat; and the selected transverse relaxation rate by the image data processor is based on the individual image element representing a proportion of one of (i) fat; (ii) water; and (iii) a water-fat mixture, respectively, in the tissue represented by the individual image element.

According to an embodiment, an input processor is configured to receive a plurality of MR image representative signal datasets of a portion of patient anatomy acquired using a pulse sequence type and representing an image comprising the plurality of individual image elements. The image data processor determines the selected parameters in response to receiving the plurality of MR image representative signal datasets.

According to an embodiment, each individual image element of the plurality of individual image elements comprises at least one of (i) a pixel; (ii) a group of pixels; (iii) a voxel; and (iv) a group of voxels.

In an embodiment, the selected transverse relaxation rate by the image data processor is based on the individual image element representing a proportion of one of (i) fat; (ii) water; and (iii) a water-fat mixture, respectively, in the tissue represented by the individual image element. In an embodiment, the selected transverse relaxation rate is the transverse relaxation rate of fat based on at least one of (a) a proportion of fat exceeding a first threshold and (b) a proportion of water being below a second threshold, in the tissue represented by the individual image element. In another embodiment, the selected transverse relaxation rate is the transverse relaxation rate of water based on at least one of (a) a proportion of water exceeding a third threshold and (b) a proportion of fat being below a fourth threshold, in the tissue represented by the individual image element. In yet another embodiment, the selected transverse relaxation rate is the composite transverse relaxation rate of both water and fat based on at least one of (a) a proportion of water and (b) a proportion of fat being between predetermined thresholds, in the tissue represented by the individual image element.

In an embodiment, the first and fourth thresholds are predetermined and are substantially the same, and wherein the second and third thresholds are predetermined and are substantially the same.

According to an embodiment, the image data processor is further configured to adaptively select at least one of the thresholds in response to data indicating a clinical procedure being performed.

In another embodiment, the image data processor is further configured to determine the proportion of at least one of (i) fat; (ii) water; and (iii) the water-fat mixture in response to at least one of (i) magnetization of fat; (ii) magnetization of water; and (iii) magnetization of the water-fat mixture, respectively, of the tissue represented by the individual image element.

In an embodiment, the display processor generates the data representing the MR image using one or more of: (i) a plurality of selected transverse relaxation rates of fat for a corresponding first subset of individual image elements; (ii) a plurality of selected transverse relaxation rates of water for a corresponding second subset of individual image elements; and (iii) a composite transverse relaxation rate of both water and fat for a third subset of individual image elements, of said plurality of individual image elements.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION OF ILLUSTRATIVE EMBODIMENTS

Embodiments of the present invention relate to evaluating properties of tissues with magnetic resonance imaging (MRI). In particular, a MR image is used to measure a characteristic that influences a particular chemical property of a tissue. In an exemplary embodiment, tissue transverse relaxation values or relaxation rates, which can readily be measured from MR images, are used to evaluate iron deposition in tissue. It is known that iron deposition influences the tissue transverse relaxation values ($T_2$ or $T_2^*$) or relaxation rates ($R_2=1/T_2$ or $R_2=1/T_2^*$).

Embodiments are directed to a method and system for providing a clinically relevant $R_{2CR}^*$ map for tissue based on the known values of an effective $R_{2eff}^*$, a water $R_{2w}^*$, and a fat $R_{2f}^*$ of the tissue. The clinically relevant $R_{2CR}^*$ map provides an accurate evaluation of iron deposition in any region of the tissue with the use of one map. Although embodiments are described herein as processing $R_2^*$ to obtain the clinically relevant $R_{2CR}^*$ map, $R_2$, $T_2^*$, or $T_2$ values and maps may alternatively be utilized by the same method and system to obtain a corresponding clinically relevant map. Additionally, although some embodiments are described with respect to liver imaging, this is exemplary and the system and methodology apply to other organ or tissue by dynamic adjustment of parameters.

A water $R_{2w}^*$ value may accurately reflect the iron deposition in most tissues or organs, but it may be inaccurate for some regions, such as those with a high fat percentage. Typically, the iron deposition has little influence on fat $R_{2f}^*$. An effective $R_{2eff}^*$ value is a $R_2^*$ value of a water-fat mixture and is generally used for iron deposition evaluation. However, the effective $R_{2eff}^*$ value also does not accurately reflect the iron deposition in regions with a high fat percentage. The clinically relevant $R_{2CR}^*$ map, of embodiments provided herein, is calculated based on the known values of the effective $R_{2eff}^*$, the water $R_{2w}^*$, and the fat $R_{2f}^*$ by incorporating the most relevant value for each individual image element of a plurality of image elements of an MR image of the tissue. In this way, the most relevant value is presented in a single map for the entire tissue of interest to enable iron deposition evaluation. Moreover, in an additional embodiment, in addition to viewing the clinically relevant $R_{2CR}^*$ map, a user may select a combination of any of the effective $R_{2eff}^*$, the water $R_{2w}^*$, and the fat $R_{2f}^*$ maps to view, thus providing for selective display of any of the sub-variants of the clinically relevant $R_{2CR}^*$ map. In another embodiment, color coding may be employed to show a particular variant of the values contributing to the clinically relevant $R_{2CR}^*$ map.

Three $R_2^*$ values may be measured as indicated below in equation [1] by an equation of the signal model. Low flip angles are used for data acquisition, so that T1 effects can be reasonably ignored in the signal model. For the n-th echo time (TE), the acquired MR signal is given by:

$$S_n = (M_w \cdot e^{-R_{2w}^* TE_n} + c_n M_f \cdot e^{-R_{2f}^* TE_n}) E_n \quad [1].$$

In this equation, the known or measured variables include: $S_n$, the measured MR signal at the n-th echo; $c_n$, the complex coefficient at the n-th TE due to the difference of fat and water in the spectrum, calculated using a known fat spectral model; and $TE_n$, the n-th echo time. The unknown variables include: $M_w$ and $M_f$, the magnetization or proton density of water and fat in the tissue, respectively; $R_{2w}^*$ and $R_{2f}^*$, representing the relaxation rates of water and fat, respectively; and $E_n$, a complex phasor having a magnitude of one, including a phase error due to systematic imperfection such as due to off-resonance, eddy-current, and a gradient delay. For simplicity, different fat species are assumed to have one common $R_{2f}^*$. Among the unknown variables, $E_n$ is not typically of clinical interest. Therefore, it is not necessary to solve for $E_n$. Taking the magnitude on both sides of equation [1] to remove $E_n$ from the signal model equation, provides:

$$|S_n| = |M_w \cdot e^{-R_{2w}^* TE_n} + c_n M_f \cdot e^{-R_{2f}^* TE_n}| \quad [2].$$

Equation [2] has four unknown variables, $M_w$, $M_f$, $R_{2eff}^*$, and $R_{2f}^*$, which can be solved using acquisitions with echoes equal to or greater than four.

In some situation, in order to reduce the complexity of the equation, the signal model is further simplified by replacing the $R_{2w}^*$ and $R_{2f}^*$ with a single effective $R_{2eff}^*$ for the water-fat mixture. The signal equations [1] and [2] become, respectively:

$$S_n = (M_w + c_n M_f) E_n e^{-R_{2eff}^* TE_n} \quad [3]; \text{and}$$

$$|S_n| = |(M_w + c_n M_f) e^{-R_{2eff}^* TE_n}| \quad [4].$$

Equation [4] reduces the unknown variables to three, $M_w$, $M_f$, and $R_{2eff}^*$, and can be solved using acquisitions with echoes equal to or greater than three.

Known methods may be used to calculate the effective $R_{2eff}^*$, water $R_{2w}^*$, and fat $R_{2f}^*$ values and maps from multi-echo data. For example, it is known for this purpose to use variants of a known method called iterative decomposition of water and fat with echo asymmetry and least-squares estimation (IDEAL) to measure $M_w$, $M_f$, the effective $R_{2eff}^*$, the water $R_{2w}^*$, and/or the fat $R_{2f}^*$ concurrently. Another known method involves using a non-linear fitting method, such as a Levenberg-Marquardt algorithm (also known as the damped least-squares method) in non-linear equations relating to $S_n$ (such as equations [2] and [4]). The Levenberg-Marquardt algorithm provides a numerical solution to the problem of minimizing a function, generally nonlinear, over a space of parameters of the function. The Levenberg-Marquardt based methods have been used to fit the resultant solutions of $M_w$, $M_f$, the effective $R_{2eff}^*$, the water $R_{2w}^*$, and/or the fat $R_{2f}^*$ maps.

According to an embodiment, clinically relevant $R_{2CR}^*$ is defined as:

$$R_{2CR}^* = \begin{cases} R_{2w}^* & \text{when } FP \le a \\ R_{2eff}^* & \text{when } a < FP \le b \\ R_{2f}^* & \text{when } FP > b. \end{cases} \quad [5]$$

In equation [5], a and b are application specific constant values, and $0 \le a \le b \le 1$. For example, for a liver imaging application, a and b can be chosen as $a=b=0.6$. FP is the fat percentage defined as:

$$FP = \frac{M_f}{M_w + M_f}. \qquad [6]$$

Figure 1:
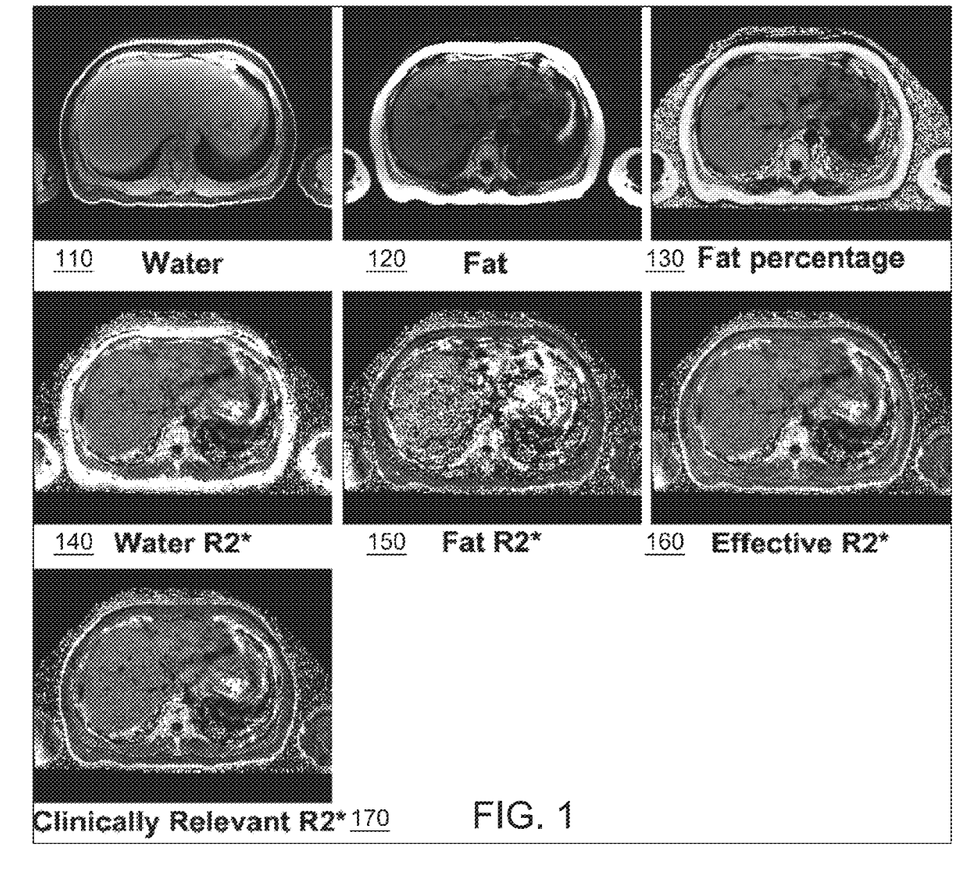
FIGS. 1 and 2 are exemplary representations used to evaluate properties of tissue obtained through MRI.
Figure 2:
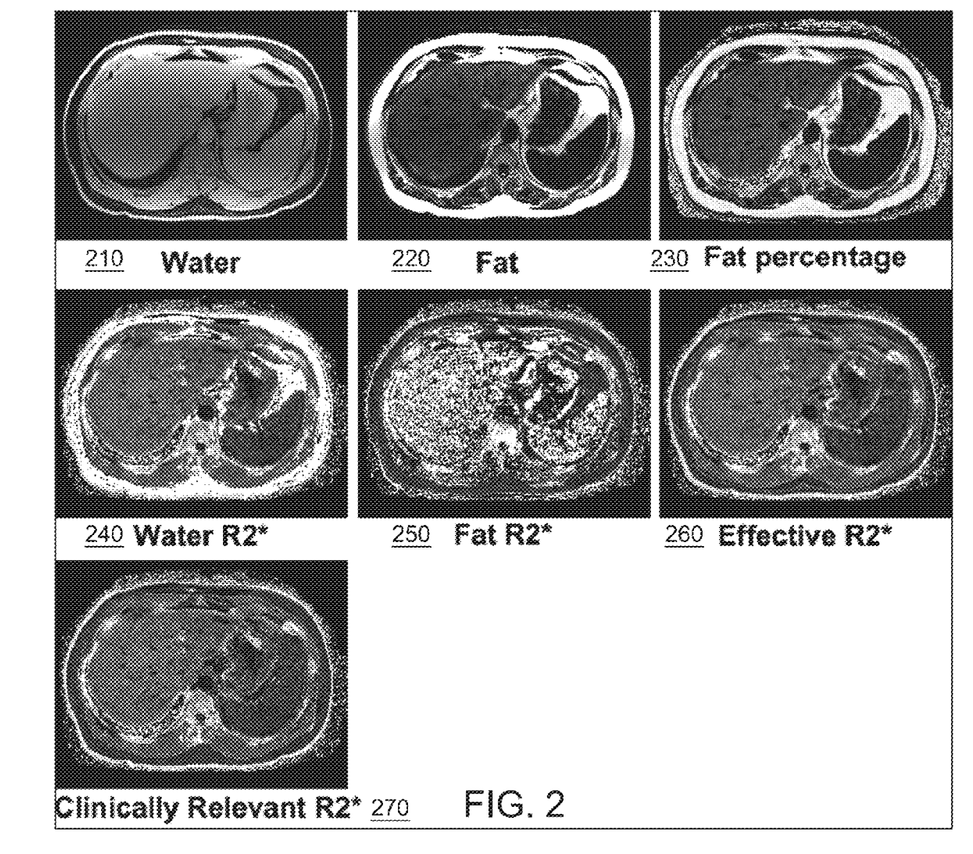

Referring to FIGS. 1 and 2, example data sets of abdominal imaging are provided. As shown in FIG. 1, a water image 110, a fat image 120, a FP map 130, a water $R_{2w}$* map 140, a fat $R_{2f}$* map 150, an effective $R_{2eff}$* map 160, and a clinically relevant $R_{2CR}$* map 170 are provided. As shown in FIG. 2, a water image 210, a fat image 220, a FP map 230, a water $R_{2w}$* map 240, a fat $R_{2f}$* map 250, an effective $R_{2eff}$* map 260, and a clinically relevant $R_{2CR}$* map 270 are provided.

Although it is the water $R_{2w}$* that reflects the iron deposition, the water $R_{2w}$* maps 140, 240 do not have accurate and reliable values for the low-water areas (i.e. subcutaneous fat). Actually, for the subcutaneous fat region, the fat $R_{2f}$* is of interest, and looking at the $R_2$* values in the subcutaneous fat region in the water $R_{2w}$* maps 140, 240 may not be useful. A similar situation is seen in the fat $R_{2f}$* maps 150, 250; for the liver region, the fat $R_{2f}$* values are noisy and do not reflect the iron deposition in the liver. The effective $R_{2eff}$* simply represents the R2* values of the water-fat mixture and has a bias in reflecting iron deposition when there is substantial fat in a region (see effective $R_{2eff}$* maps 160, 260).

Although having similar appearance to the effective $R_{2eff}$* maps 160, 260, the clinically relevant $R_{2CR}$* maps 170, 270 show the $R_2$* values which are both accurate and of clinical interest in each pixel in the corresponding body region. In the abdominal imaging case shown, the clinically relevant $R_{2CR}$* maps 170, 270 show the water $R_{2w}$* and the fat $R_{2f}$* in the regions which are of water interest or fat interest, respectively; and the clinically relevant $R_{2CR}$* maps 170, 270 reflect the iron deposition in the liver more directly than the effective $R_{2eff}$* maps 160, 260, since they are showing the water $R_{2w}$* in the liver region.

The system adaptively selects (or a user selects) a and b (see equation [5]) in response to type of clinical application and procedure being performed, so the presented clinically relevant $R_{2CR}$* map may wholly comprise one of the three source $R_2$* maps. Specifically, $$\text{When } a = b = 1, \quad R^*_{2CR} \xleftrightarrow{\text{equivalent}} R^*_{2w}$$
$$\text{When } a = 0 \text{ and } b = 1, \quad R^*_{2CR} \xleftrightarrow{\text{equivalent}} R^*_{2eff} \qquad [7]$$
$$\text{When } a = b = 0, \quad R^*_{2CR} \xleftrightarrow{\text{equivalent}} R^*_{2f}$$

Therefore, the clinically relevant $R_{2CR}$* map effectively represents the information from the three source $R_2$* maps: the water $R_{2w}$* map, the fat $R_{2f}$* map, and the effective $R_{2eff}$* map. In an interactive display embodiment, a and b may be chosen to selectively display only one or two of the sub-variants of $R_{2CR}$*. In an embodiment, color coding is employed to identify a source variant of the clinically relevant $R_{2CR}$*.

Figure 3:
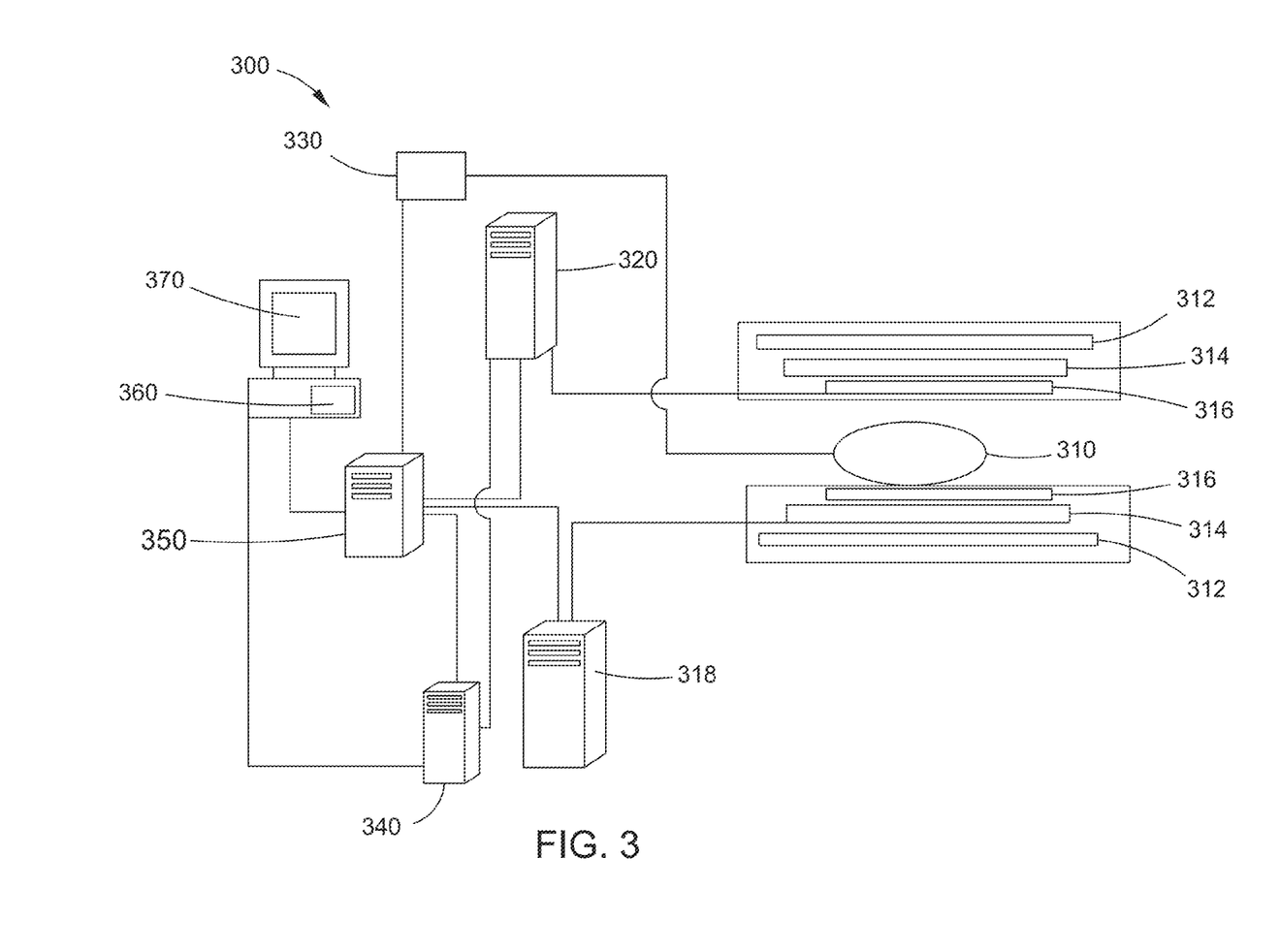
FIG. 3 shows a system for evaluating properties of tissue with MRI, according to embodiments provided herein.

Turning to FIG. 3, a system 300 for evaluating properties of tissue from Magnetic Resonance (MR) signal data of the tissue is provided. The system 300 includes a source 310 of the tissue, such as a patient. 312, 314, and 316 represent the coils and magnets of an MRI system and are, in an exemplary embodiment, a high field magnet 312, a gradient coil 314, and a radio-frequency (RF) coil 316. Processors 318 (gradient and shim coil controller) and 320 (radio-frequency controller) control the MR magnets and coils. The MRI system components 312, 314, and 316 and processors 318 and 320 depicted in FIG. 3 are one example of an MRI system; other components and processors may be used as known to one of skill in the art to obtain an MR image of tissue.

The system 300 further includes an input processor 330, an image data processor 340, a display processor 360, and an interface 370. A central control system 350 controls the overall operation of and data communication between each of the processors 318, 320, 330, 340, and 360.

Now turning to a more detailed description of the system 300, the MRI system components 312, 314, and 316 and processors 318 and 320 are configured to obtain an MR image of tissue of a patient 310. The MR image is comprised of a plurality of individual image elements. The image data processor 340 is configured to select, for each individual image element of the plurality of individual image elements of the MR image of the tissue, one of a plurality of parameters of the tissue corresponding to the individual image element. The display processor 360 is configured to generate data representing the MR image using the selected parameter to represent the individual image element. In this manner, a map may be generated using the data representing the MR image, with each individual image element represented by a parameter that accurately reflects the individual image element. The map is displayed on the interface 370.

In particular, in one embodiment, the parameters are related to iron deposition in the tissue. For example, the parameters may be tissue transverse relaxation values ($T_2$ or $T_2$*) or relaxation rates ($R_2 = 1/T_2$ or $R_2$* $= 1/T_2$*). In one embodiment, the parameters are one of (i) a transverse relaxation rate of fat; (ii) a transverse relaxation rate of water; and (iii) a composite transverse relaxation rate of both water and fat. The image data processor 340 selects the parameter (e.g., transverse relaxation rate) that satisfies certain criteria and is thus an accurate representation of the individual image element. The selected transverse relaxation rate by the image data processor 340 may be, in one embodiment, based on the individual image element representing a proportion of one of (i) fat; (ii) water; and (iii) a water-fat mixture, respectively, in the tissue represented by the individual image element.

The input processor 330, according to an embodiment, is configured to receive a plurality of MR image representative signal datasets of a portion of patient anatomy (e.g., tissue) using a pulse sequence type and representing an image comprising the plurality of individual image elements. In response to receiving the plurality of MR image representative signal datasets from the input processor 330, the image data processor 340 determines the selected parameters.

In an embodiment, the individual image elements are one of (i) a pixel; (ii) a group of pixels; (iii) a voxel; and (iv) a group of voxels.

In the exemplary embodiment in which the parameters are the transverse relaxation rates and the selected rate is based on the individual image element representing a proportion of fat, water, and/or a water-fat mixture, respectively, threshold values may be used by the image data processor 340 to select the transverse relaxation rate. In an embodiment, the selected transverse relaxation rate is the transverse relaxation rate of fat based on at least one of (a) a proportion of fat exceeding a first threshold and (b) a proportion of water being below a second threshold, in the tissue represented by the individual image element. In another embodiment, the selected transverse relaxation rate is the transverse relaxation rate of water based on at least one of (a) a proportion of water exceeding a third threshold and (b) a proportion of fat being below a fourth threshold, in the tissue represented by the individual image element. The selected transverse relaxation rate may be the composite transverse relaxation rate of both water and fat based on at least one of (a) a proportion of water and (b) a proportion of fat being between predetermined thresholds, in the tissue represented by the individual image element. See equations [5], [6], and [7] above.

In an embodiment, the first and fourth thresholds are predetermined and are substantially the same, and the second and third thresholds are predetermined and are substantially the same. In an embodiment, the image data processor 340 is further configured to adaptively select one or more of the threshold values in response to data indicating a clinical procedure being performed. For example, as noted above, for a liver imaging application, a and b can be chosen as a=b=0.6.

The proportion of fat, water, and the water-fat mixture may be based on, respectively, magnetization of fat, magnetization of water, and magnetization of the water-fat mixture, of the tissue represented by the individual image element.

Figure 4:
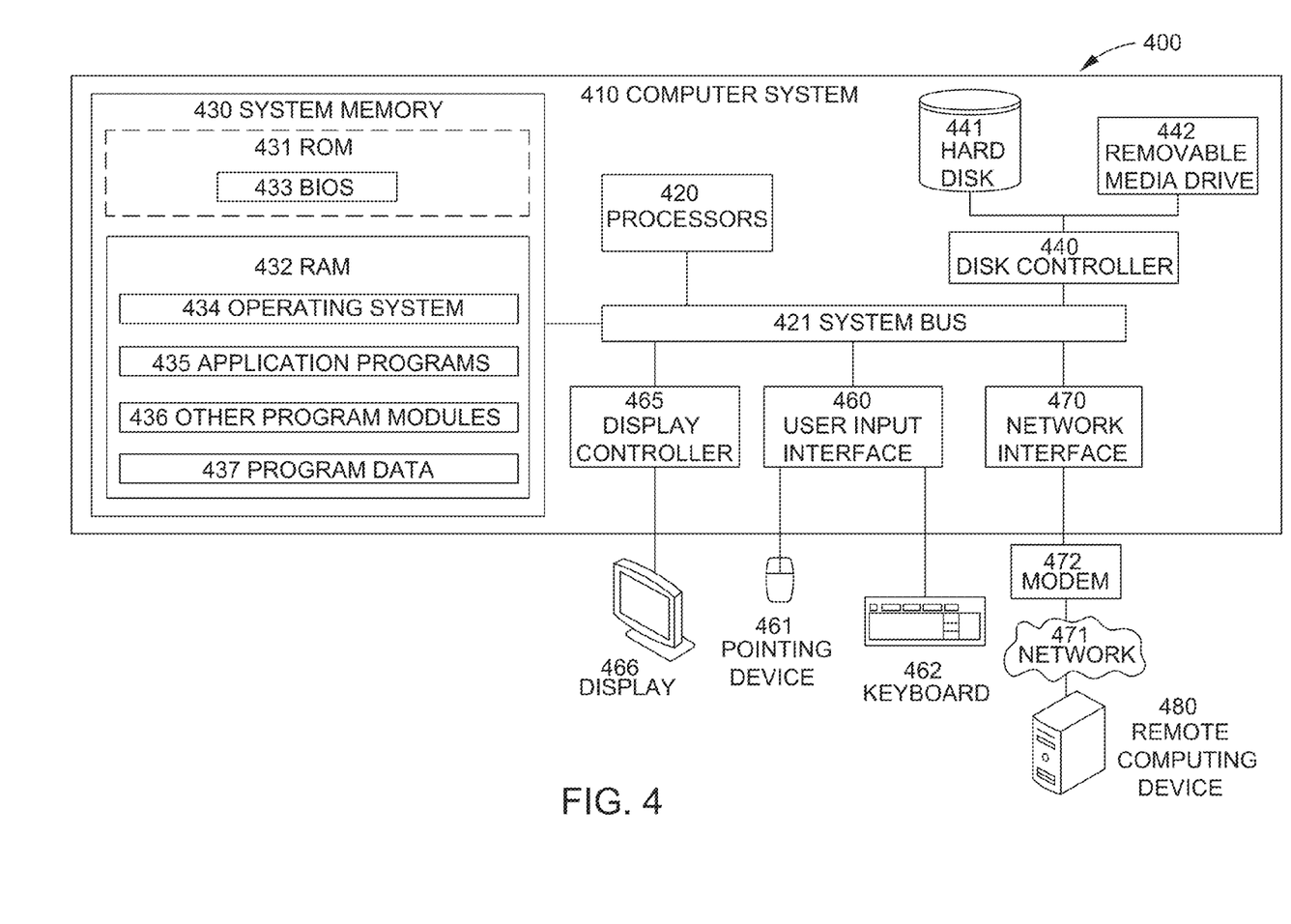
FIG. 4 is an exemplary computing environment in which embodiments disclosed herein may be implemented.

The display processor 360 generates the data representing the MR image using one or more of: (i) a plurality of selected transverse relaxation rates of fat for a corresponding first subset of individual image elements; (ii) a plurality of selected transverse relaxation rates of water for a corresponding second subset of individual image elements; and (iii) a composite transverse relaxation rate of both water and fat for a third subset of individual image elements, of said plurality of individual image elements. The generated data is displayed on the interface 370. In this manner, each individual image element is represented by a transverse relaxation rate that best represents the corresponding individual image element. As described above, a user may manipulate the generated image to display the individual sub-variants, and the generated image may be color coded to indicate the various sub-variants FIG. 4 illustrates an exemplary computing environment 400 within which embodiments of the invention may be implemented. Computing environment 400 may include computer system 410, which is one example of a computing system upon which embodiments of the invention may be implemented. Computers and computing environments, such as computer 410 and computing environment 400, are known to those of skill in the art and thus are described briefly here.

As shown in FIG. 4, the computer system 410 may include a communication mechanism such as a bus 421 or other communication mechanism for communicating information within the computer system 410. The system 410 further includes one or more processors 420 coupled with the bus 421 for processing the information. The processors 420 may include one or more central processing units (CPUs), graphical processing units (GPUs), or any other processor known in the art.

The computer system 410 also includes a system memory 430 coupled to the bus 421 for storing information and instructions to be executed by processors 420. The system memory 430 may include computer readable storage media in the form of volatile and/or nonvolatile memory, such as read only memory (ROM) 431 and/or random access memory (RAM) 432. The system memory RAM 432 may include other dynamic storage device(s) (e.g., dynamic RAM, static RAM, and synchronous DRAM). The system memory ROM 431 may include other static storage device(s) (e.g., programmable ROM, erasable PROM, and electrically erasable PROM). In addition, the system memory 430 may be used for storing temporary variables or other intermediate information during the execution of instructions by the processors 420. A basic input/output system 433 (BIOS) containing the basic routines that help to transfer information between elements within computer system 410, such as during start-up, may be stored in ROM 431. RAM 432 may contain data and/or program modules that are immediately accessible to and/or presently being operated on by the processors 420. System memory 430 may additionally include, for example, operating system 434, application programs 435, other program modules 436 and program data 437.

The computer system 410 also includes a disk controller 440 coupled to the bus 421 to control one or more storage devices for storing information and instructions, such as a magnetic hard disk 441 and a removable media drive 442 (e.g., floppy disk drive, compact disc drive, tape drive, and/or solid state drive). The storage devices may be added to the computer system 410 using an appropriate device interface (e.g., a small computer system interface (SCSI), integrated device electronics (IDE), Universal Serial Bus (USB), or FireWire).

The computer system 410 may also include a display controller 465 coupled to the bus 421 to control a display or monitor 466, such as a cathode ray tube (CRT) or liquid crystal display (LCD), for displaying information to a computer user. The computer system 410 includes an input interface 460 and one or more input devices, such as a keyboard 462 and a pointing device 461, for interacting with a computer user and providing information to the processors 420. The pointing device 461, for example, may be a mouse, a trackball, or a pointing stick for communicating direction information and command selections to the processors 420 and for controlling cursor movement on the display 466. The display 466 may provide a touch screen interface which allows input to supplement or replace the communication of direction information and command selections by the pointing device 461.

The computer system 410 may perform a portion or all of the processing steps of embodiments of the invention in response to the processors 420 executing one or more sequences of one or more instructions contained in a memory, such as the system memory 430. Such instructions may be read into the system memory 430 from another computer readable medium, such as a hard disk 441 or a removable media drive 442. The hard disk 441 may contain one or more datastores and data files used by embodiments of the present invention. Datastore contents and data files may be encrypted to improve security. The processors 420 may also be employed in a multi-processing arrangement to execute the one or more sequences of instructions contained in system memory 430. In alternative embodiments, hardwired circuitry may be used in place of or in combination with software instructions. Thus, embodiments are not limited to any specific combination of hardware circuitry and software.

As stated above, the computer system 410 may include at least one computer readable medium or memory for holding instructions programmed according to embodiments provided herein and for containing data structures, tables, records, or other data described herein. The term "computer readable medium" as used herein refers to any medium that participates in providing instructions to the processors 420 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 441 or removable media drive 442. Non-limiting examples of volatile media include dynamic memory, such as system memory 430. Non-limiting examples of transmission media include coaxial cables, copper wire, and fiber optics, including the wires that make up the bus 421. Transmission media may also take the form of acoustic or light waves, such as those generated during radio wave and infrared data communications.

The computing environment 400 may further include the computer system 410 operating in a networked environment using logical connections to one or more remote computers, such as remote computer 480. Remote computer 480 may be a personal computer (laptop or desktop), a mobile device, a server, a router, a network PC, a peer device or other common network node, and typically includes many or all of the elements described above relative to computer system 410. When used in a networking environment, computer system 410 may include modem 472 for establishing communications over a network 471, such as the Internet. Modem 472 may be connected to system bus 421 via user network interface 470, or via another appropriate mechanism.

Network 471 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 410 and other computers (e.g., remote computing system 480). The network 471 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 471.

As described herein, the various systems, subsystems, agents, managers and processes can be implemented using hardware components, software components and/or combinations thereof.

Although the present invention has been described with reference to exemplary embodiments, it is not limited thereto. Those skilled in the art will appreciate that numerous changes and modifications may be made to the preferred embodiments of the invention and that such changes and modifications may be made without departing from the true spirit of the invention. It is therefore intended that the appended claims be construed to cover all such equivalent variations as fall within the true spirit and scope of the invention.

We claim:

1. A system for evaluating properties of tissue from Magnetic Resonance (MR) signal data of the tissue, the system comprising:
    an image data processor configured to select, for each individual image element of a plurality of individual image elements of an MR image of the tissue, a particular parameter from a plurality of parameters of the tissue; and
    a display processor configured to generate data representing the MR image using the particular parameter to represent the individual image element,
    wherein the plurality of parameters include a first parameter associated with water, a second parameter associated with a fat/water mixture having a fat percentage FP determined for the individual image element, and a third parameter associated with fat;
    wherein a and b are constants selected for the MR image such that $0 \leq a \leq b \leq 1$; and
    wherein the particular parameter is equal to:
    the first parameter when $FP \leq a$;
    the second parameter when $a < FP \leq b$; and
    the third parameter when $FP > b$.

2. The system of claim 1, wherein the parameters of the tissue comprise parameters related to iron deposition in the tissue.

3. The system of claim 2, wherein the plurality of parameters comprise at least one of tissue transverse relaxation values and tissue transverse relaxation rates.

4. The system of claim 1, wherein:
    the fat percentage FP of an individual image element is equal to $M_f/(M_w+M_f)$;
    $M_f$ is a proton density of fat in the tissue associated with the individual image element; and
    $M_w$ is a local proton density of water in the tissue associated with the individual image element.

5. The system of claim 1, further comprising:
    an input processor configured to receive a plurality of MR image representative signal datasets of a portion of patient anatomy acquired using a pulse sequence type and representing an image comprising the plurality of individual image elements;
    wherein the image data processor determines the particular parameters in response to receiving the plurality of MR image representative signal datasets.

6. The system of claim 1, wherein each individual image element of the plurality of individual image elements comprises at least one of (i) a pixel; (ii) a group of pixels; (iii) a voxel; and (iv) a group of voxels.

7. A system for evaluating iron deposition of tissue from Magnetic Resonance (MR) signal data of the tissue, the system comprising:
    an image data processor configured to select a particular parameter for each individual image element of a plurality of individual image elements of an MR image of the tissue; and
    a display processor configured to generate data representing the MR image using the particular parameter selected to represent each of the individual image elements,
    wherein a and b are constants selected for the MR image such that $0 \leq a \leq b \leq 1$;
    wherein FP represents a fat percentage determined for the individual image element based on local proton densities of fat and water; and
    wherein:
    the particular parameter is a parameter associated with water when $FP \leq a$;
    the particular parameter is a parameter associated with a fat/water mixture having a fat percentage FP when $a < FP \leq b$; and
    the particular parameter is a parameter associated with fat when $FP > b$.

8. The system of claim 7, wherein
    the fat percentage FP of an individual image element is equal to $M_f/(M_w+M_f)$;

$M_f$ is a proton density of fat in the tissue associated with the individual image element; and $M_w$ is a local proton density of water in the tissue associated with the individual image element.

9. The system of claim 8, wherein the particular parameters are determined using an iterative decomposition of water and fat with echo asymmetry and least-squares estimation technique.

10. The system of claim 8, wherein the particular parameters are determined using a non-linear fitting method applied to equations describing the measured MR signals $S_n$ at the $n^{th}$ echoes.

11. The system of claim 8, wherein the image data processor is further configured to adaptively select at least one of the constants a and b based on data indicating a clinical procedure being performed.

12. The system of claim 8, wherein the particular parameter is a tissue transverse relaxation rate.

13. The system of claim 8, wherein the particular parameter is a tissue transverse relaxation value.

14. The system of claim 7, further comprising:
an input processor configured to receive a plurality of MR image representative signal datasets of a portion of patient anatomy acquired using a pulse sequence type and representing an image comprising the plurality of individual image elements;
wherein the image data processor determines the particular parameters in response to receiving the plurality of MR image representative signal datasets.

15. The system of claim 7, wherein each individual image element of the plurality of individual image elements comprises at least one of (i) a pixel; (ii) a group of pixels; (iii) a voxel; and (iv) a group of voxels.

16. The system of claim 7, wherein the particular parameters comprise one of: (i) $R_2^*$; (ii) $R_2$; (iii) $1/T_2^*$; and (iv) $1/T_2$.

17. A method of evaluating properties of tissue from Magnetic Resonance (MR) signal data of the tissue, the method comprising:
receiving, by a data image processor, a plurality of individual image elements of an MR image of the tissue;

selecting, by the data image processor, for each of the individual image elements of the plurality of individual image elements of the MR image of the tissue, a particular parameter from a plurality of parameters of the tissue; and generating, at a display processor, data representing the MR image using the particular parameters to represent the individual image elements, wherein the plurality of parameters include a first parameter associated with water, a second parameter associated with a fat/water mixture having a fat percentage FP determined for the individual image element, and a third parameter associated with fat;

wherein a and b are constants selected for the MR image such that $0 \leq a \leq b \leq 1$; and wherein the particular parameter is equal to:
the first parameter when $FP \leq a$;
the second parameter when $a < FP \leq b$; and
the third parameter when $FP > b$.

18. The method of claim 17, wherein the plurality of parameters of the tissue comprise parameters related to iron deposition in the tissue.

19. The method of claim 17, wherein the plurality of parameters comprise at least one of a tissue transverse relaxation rates and tissue transverse relaxation values.

20. The method of claim 17, further comprising:
receiving, by an input processor, a plurality of MR image representative signal datasets of a portion of patient anatomy acquired using a pulse sequence type and representing an image comprising the plurality of individual image elements;
wherein the image data processor determines the particular parameters in response to receiving the plurality of MR image representative signal datasets.

21. The method of claim 17, wherein each individual image element of the plurality of individual image elements comprises at least one of (i) a pixel; (ii) a group of pixels; (iii) a voxel; and (iv) a group of voxels.

* * * * *